United States Patent [19]

Ikeya et al.

[11] Patent Number: 5,412,236

[45] Date of Patent: May 2, 1995

[54] COMPOUND SEMICONDUCTOR DEVICE AND METHOD OF MAKING IT

[75] Inventors: Masahisa Ikeya; Tadashi Saito; Kazuyuki Inokuchi, all of Tokyo, Japan

[73] Assignee: Oki Electric Industry Co., Ltd., Tokyo, Japan

[21] Appl. No.: 230,873

[22] Filed: Apr. 20, 1994

Related U.S. Application Data

[63] Continuation of Ser. No. 917,381, Jul. 23, 1992, abandoned.

[30] Foreign Application Priority Data

Jul. 25, 1991 [JP] Japan .................. 3-184939

[51] Int. Cl.⁶ .................. H01L 29/48; H01L 29/80
[52] U.S. Cl. .................. 257/282; 257/194; 257/283; 257/284
[58] Field of Search .................. 257/194, 282, 283, 284

[56] References Cited

U.S. PATENT DOCUMENTS

| | | | |
|---|---|---|---|
| 4,774,555 | 9/1988 | Kohn et al. .................. | 257/194 |
| 4,916,498 | 4/1990 | Berenz .................. | 257/283 |

FOREIGN PATENT DOCUMENTS

| | | | |
|---|---|---|---|
| 61-99380 | 5/1986 | Japan .................. | 257/283 |
| 2-65141 | 3/1990 | Japan . | |

OTHER PUBLICATIONS

Technical Paper of the Inst. of Electronics and Communication Engineers of Japan, ED85-101 to 113, Nov. 22, 1985, pp. 1 to 6, "A Fully Implanted SHF Low Noise GaAs MESFET", Ohta et al.

Ralph E. Williams, *Gallium Arsenide Processing Techniques*, Artech House, Inc., 1984, pp. 272–278.

*Primary Examiner*—Mark V. Prenty
*Attorney, Agent, or Firm*—Spencer, Frank & Schneider

[57] ABSTRACT

In a method of making a semiconductor device, an active layer and a heavily doped cap layer are formed in turn on a semiconductor substrate, a first electrode is formed on the cap layer, a mask of a two-layer structure is formed on the cap layer, with the mask having an insulating film pattern having a non-inverted tapered opening, and a resist pattern having an inverted tapered opening and continuous with the non-inverted tapered opening, these openings being separated by a predetermined distance from the first electrode, and then a recess is formed, by performing an isotropic etching of the heavily doped layer exposed in the openings, with the recess having a bottom surface and a side wall surface rising from an edge of the bottom surface toward the upper edge with a constant radium off curvature. An oblique vapor deposition is then performed to form a second electrode to cover the bottom surface and the part of the side wall surface.

8 Claims, 10 Drawing Sheets

$L_6 = L_3 + L_4 + L_5$

COMPOUND SEMICONDUCTOR DEVICE AND METHOD OF MAKING IT

This is a continuation of Ser. No. 917,381, filed Jul. 23, 1992, abandoned.

BACKGROUND OF THE INVENTION

The present invention relates to a compound semiconductor device and a method of making the compound semiconductor device.

Semiconductor devices include diodes having two electrodes and transistors having three or more electrodes. Prior to description of the invention, a method of making a field-effect transistor (FET) in the prior art is described with reference to FIG. 6A to FIG. 6F. This method is disclosed in the Technical paper of the institute of Electronics and Communication Engineers of Japan, ED 85-101, Nov. 22, 1985, pages 1 to 6. The method is for forming a GaAs FET and is called the through-implantation method. FIG. 6A to FIG. 6F are sectional diagrams at various process steps of the through-implantation method.

First, ions are selectively injected into a semi-insulating GaAs substrate 10 to form an n-type layer 12 (FIG. 6A). Then, an $SiO_2$ film 14 is formed to a suitable thickness by a CVD method over an area where a gate electrode will be formed (FIG. 6B). Then, optical lithography is used to form an n+-type layer 16 (FIG. 6C). That is, a resist layer is first formed, and a resist pattern 18 having an opening over an area including the $SiO_2$ film 14 and its surrounding region is formed, and Si is heavily ion-implanted using the resist pattern 18 and the $SiO_2$ film 14 as a mask, to form the n+-type layer 16. The $SiO_2$ layer 14 acts as a partial mask: some Si ions pass through the n+-type layer 14 and a shallow n+-type layer 16b is formed under the $SiO_2$ layer 14. A deep n+-type layer 16a is formed in the region surrounding the $SiO_2$ layer 14. The layer 16 is the aggregate of the layers 16a and 16b.

The $SiO_2$ layer 14 and the resist pattern 18 are then removed, and the substrate is annealed, and source and drain electrodes 20 and 22 are formed (FIG. 6D). A resist is formed over the n+-type layer 16, and a resist pattern 26 is formed by optical lithography. The resist pattern 26 has an opening 24 over the area where the gate electrode will be formed. Isotropic, wet etching is then performed using the resist pattern 26 as a mask to recess-etch the n+-type layer 16b and the n-type layer 12 to form a structure having a recess 28 (FIG. 6E). A gate metal is vapor-deposited in the vertical direction, using the resist pattern 26 as a mask, to form a gate electrode 30. The resist pattern 26 is thereafter removed to form an FET structure (FIG. 6F). FIG. 7 shows, in an enlarged scale, the gate electrode and its surrounding structure.

In the example described above, the isotropic etching is employed in a method of making GaAs FET in which ion implantation is also used. The process employing the isotropic etching can be used in a method of making an n+/n (such as n+/n GaAs, n+/n InP or n+/n Ge) MES FET where an epitaxial method is also used, and a method of making a n+GaAs/n AlGaAs HEMT (high electron mobility transistor) and the like.

In the process of forming the gate electrode 30, the resist pattern 26 is used as a mask during the isotropic etching to form the recess 28 reaching the n-type layer 12, and gate metal is vapor-deposited vertically, so that the gate electrode will be symmetrical.

As will be seen from FIG. 7, the distance $\beta$ between the lower edge of the gate electrode 30 where it is in contact with the n-type layer 12 and the boundary between the n-type layer 12 and the n+-type layer 16b, along the bottom surface 28a and the inclined side surface 28b of the recess 28 is long, so that the source resistance of the FET is high. The mutual conductance is therefore low, degrading the FET characteristics.

Moreover, if the adhesion of the resist pattern 26 to the substrate 10 is not adequate the n+-type layer 16b and the n-type layer 12 under the resist pattern 26 is side-etched, and the above-mentioned distance is increased. The side-etching may extend up to the area $\alpha$ where the source electrode 20 is provided.

Furthermore, where the carrier concentration in the layers 16b and 12 is changed due to heat treatment after the ion-implantation, the amount of the recess-etching varies, and the above-mentioned distance $\beta$ is changed. As a result, the reproducibility of the source resistance is low.

SUMMARY OF THE INVENTION

An object of the invention is to prevent an increase in the source resistance and a reduction in the mutual conductance of a semiconductor device.

In particular, the invention aims at providing a semiconductor device having a minimum source resistance, and a gate length shorter than the dimension in an opening along the gate length direction, while maintaining Schottky gate characteristics. The semiconductor device may be an FET or a diode having part of the FET.

The method of making a semiconductor device according to the invention comprises:

(a) forming an active layer and a heavily doped cap layer in turn on a semiconductor substrate, (b) forming a first electrode on the cap layer, (c) forming a mask of a two-layer structure on the heavily doped layer, with the mask having an insulating film pattern having a non-inverted tapered opening, and a resist pattern having an inverted tapered opening and continuous with the non-inverted tapered opening, these openings being separated by a predetermined distance from the first electrode, (d) forming a recess, by performing an isotropic etching of the heavily doped layer exposed in the openings, the recess having a bottom surface and a side wall surface rising from an edge of the bottom surface toward the upper edge with a constant radius of curvature, and (e) performing an oblique vapor deposition to form a second electrode to cover the bottom surface and a part of the side wall surface.

BRIEF DESCRIPTION OF THE DRAWINGS

FIG. 2E and FIG. 2F are plan views showing the semiconductor device at the steps shown in FIG. 1G and. FIG. 1H.

DETAILED DESCRIPTION OF THE PREFERRED EMBODIMENTS

A method of making a semiconductor device of an embodiment of the invention will now be described with reference to FIG. 1A to FIG. 1H, FIG. 2A to FIG. 2F, FIG. 3 to FIG. 5. In the following embodiment, a GaAs HEMT device formed by the epitaxial method will be described as an example. It should, however, be noted that the description is by way of example and the scope of the invention is not limited to the specific embodiment. The drawings only show the shape and disposition of a device of the invention schematically.

FIG. 1A to FIG. 1H and FIG. 2A to FIG. 2F are first referred to. First, a semi-insulating GaAs substrate 46 is prepared. A buffer layer 48 of a high resistance is formed by an epitaxial method to a thickness of 0.2 to 0.5 μm. Then an undoped GaAs layer 50 is formed on the buffer layer 48.

Figure 1A:
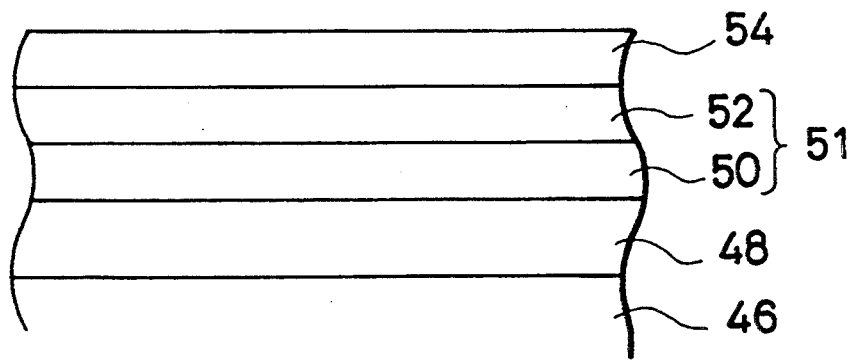
FIG. 1A to FIG. 1H are sectional views showing a semiconductor device at various process steps in a method for forming an embodiment according to the invention.

In the drawings other than FIG. 1A, the substrate 46 and the buffer layer 48 are omitted. Then, an n-type AlGaAs layer 52 and an n+-type GaAs layer 54 are formed in turn on the layer 50 by the epitaxial growth method, to obtain a structure shown in FIG. 1A. The n-type AlGaAs layer 52 supplies two-dimensional electron gas to the interface between the n-type AlGaAs layer 52 and the GaAs layer 50, and the two-dimensional electron gas forms a channel of the FET. The n-type AlGaAs layer 52 has an Si-ion concentration on the order of about $3 \times 10^{17}/cm^3$ and has a thickness of about 1000 Angstroms. The n-type AlGaAs layer 52 is also referred to as a lightly doped layer because of its lower concentration of impurities compared with the n+ GaAs layer 54. The n+-type GaAs layer 54 functions as a layer doped with an impurity at a high concentration. For instance, it is doped with Si ions at a concentration on the order of $2 \times 10^{18}/cm^3$. It is also referred to as a heavily doped layer. The layer 54 has a thickness of about 1000 Angstroms. In the embodiment under consideration, the two layers 50 and 52 together form an active layer 51, while the layer 54 on the top is called a cap layer.

Figure 1B:
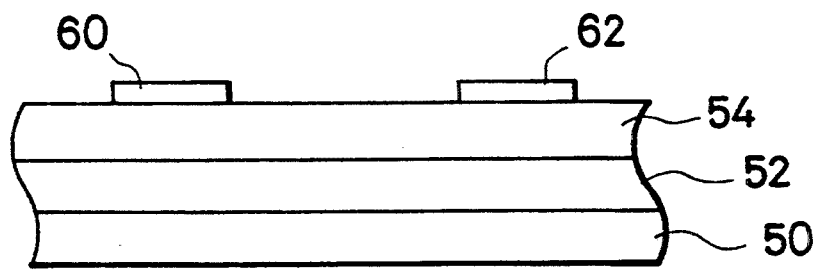
Figure 2A:
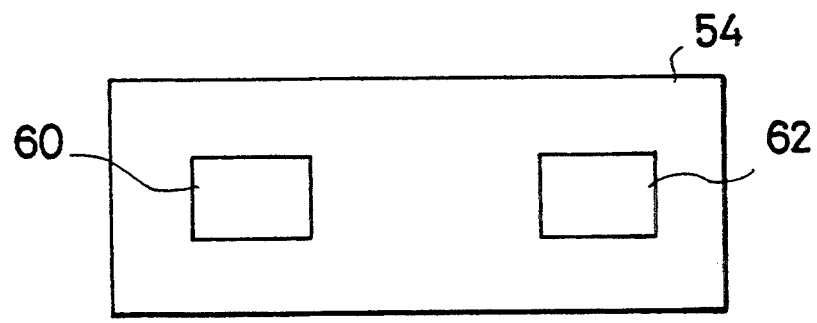
FIGS. 2A and FIG. 2B are plan views showing the semiconductor device at the steps shown in FIG. 1B and FIG. 1D, respectively.
Figure 2B:
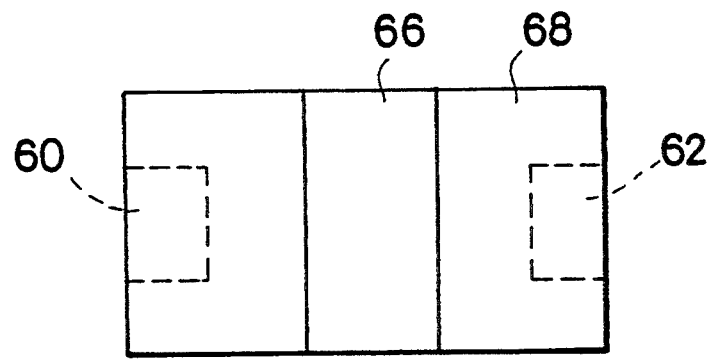
Figure 2C:
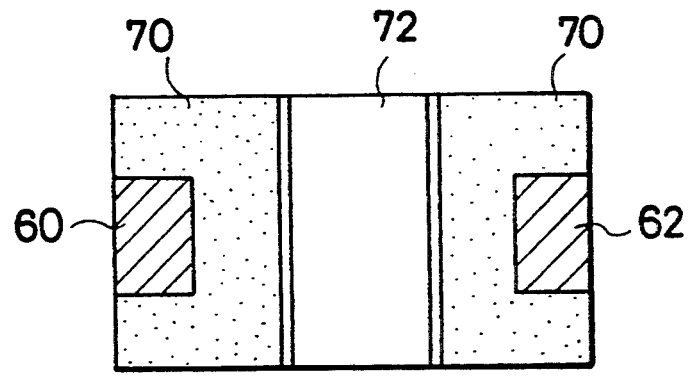
FIG. 2C is a sectional view along line IIC—IIC in FIG. 1E.

Then, using conventional techniques, a source electrode (also called a first electrode) 60 and a drain electrode (also called a third electrode) 62, which form two main electrodes of the FET are formed, as shown in FIG. 1B and FIG. 2A. The electrodes 60 and 62 are formed to have an ohmic contact with the n+-type GaAs layer 54.

Figure 1C:
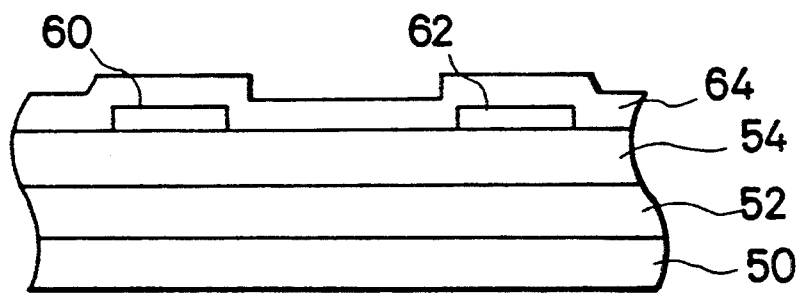
Figure 1D:
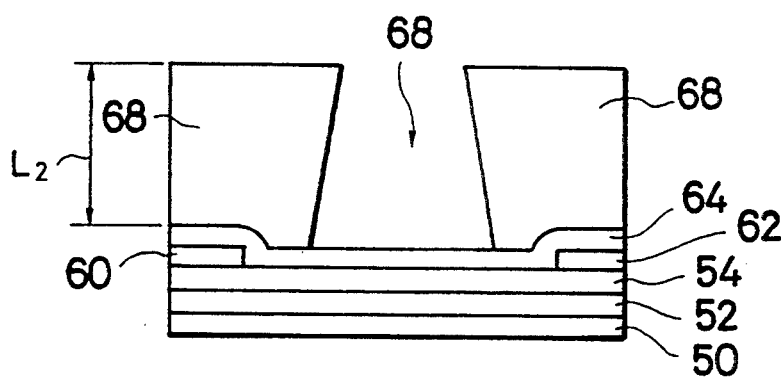
Figure 1E:
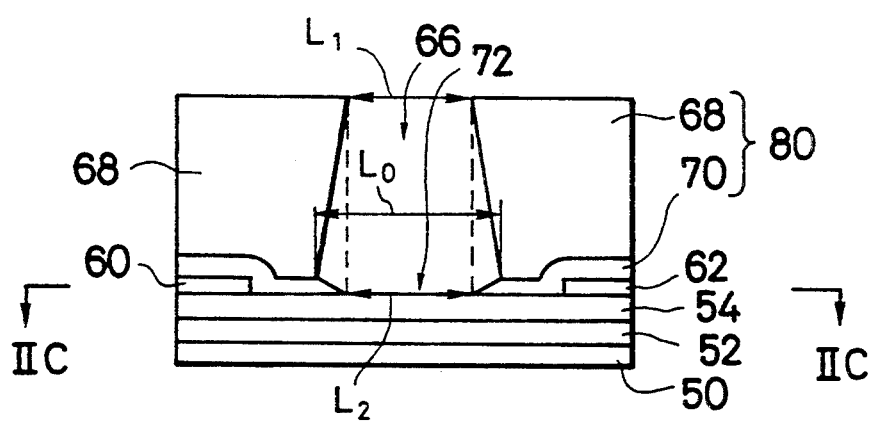
Figure 2D:
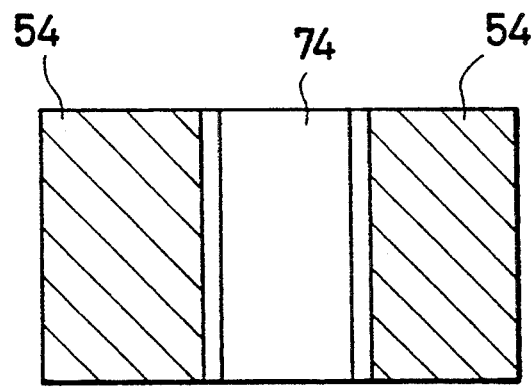
FIG. 2D is a sectional view along line IID—IID in FIG. 1F.

Then, an insulating film 64, e.g., of Si-N film, of about 1000 Angstroms thick is formed over the entirety of the layer 54 on which the main electrodes have been formed (FIG. 1C). Then, a resist layer 68 having an inversely tapered opening 66 at a predetermined position between the two main electrodes 60 and 62 is formed using optical lithography to obtain a structure shown in FIG. 1D and FIG. 2B. The "inversely tapered opening" is an opening having a larger dimension (in the direction of the gate length) at the bottom edge than at the top edge as illustrated in FIG. 1D. That is, the distance $L_0$ between the opposite edges at the bottom of the opening 66 is larger than the distance $L_1$ between the opposite edges at the top of the opening 66. The resist layer 68 may be of any suitable material. In the example under consideration, the resist layer 68 is made of LMR which is a negative-type resist. The resist is deposited to a thickness of $L_8$ of about 4000 Angstroms, and patterned by a suitable conventional method to form a resist pattern 68 having the inversely tapered opening 66. Then, using the resist pattern 68 as a mask, and using the n-type AlGaAs layer 52 as an etching stopper, the underlying insulating film 64 is etched to form an insulating film pattern 70 as shown in FIG. 1E and FIG. 2D. The etching in this case is preferably an anisotropic etching, and may for example a reactive ion etching or other dry etching. If reactive ion etching is employed, the etching gas may, for example, be $SF_5$, $CF_4$, or some other suitable source of ions. By this etching, a non-inverted tapered opening 72 is formed. The "non-inverted tapered opening" is an opening having a larger dimension (in the direction of the gate length) at the top edge than at the bottom edge as illustrated in the FIG. 1E. As a result, the distance $L_2$ between the opposite edges of the opening 72 at the bottom of the opening 72 is smaller than the distance $L_0$ between the opposite edges at the top of the opening 72 (the bottom of the opening 66), which is larger than-the distance $L_1$ between the top, opposite edges of the opening 66. It is possible to make $L_2$ to be substantially equal to $L_1$. A mask 80 of a two-layer configuration and having such an opening is thus formed.

Figure 1F:
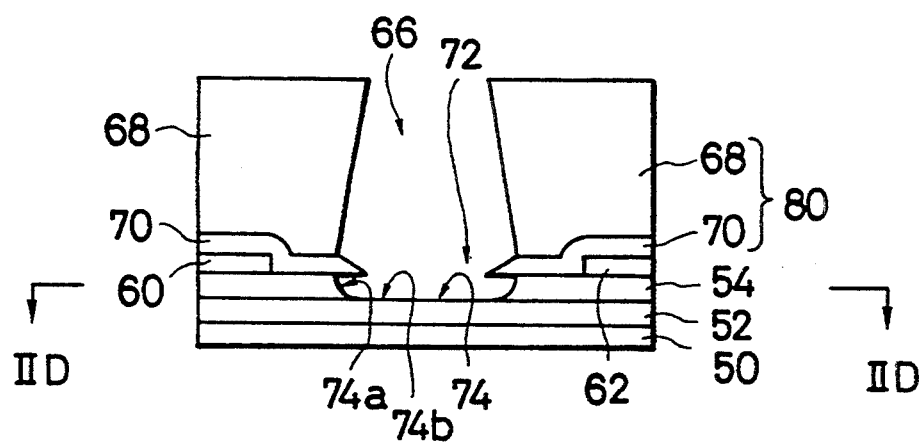

Then, using the two-layer mask 80, an isotropic etching, which may be either a wet etching or a dry etching, is made to etch the underlying layer (54) or layers (52 and 54) exposed in the openings 66 and 72 to form a recess 74 of a suitable depth to obtain a structure shown in FIG. 1F and FIG. 2D. It may be designed so that only the n+-type GaAs layer 54 is etched, or part of the n-type AlGaAs layer 52 is also etched. Alternatively, the etching may leave a thin part of the n+-type GaAs layer 54. As is well known, the isotropic etching etches the layer equally in all directions (including vertical and horizontal directions). By this etching, the underlying layer (54) or layers (52 and 54) are side-etched to the same distance as the depth to which the layer or layers are etched. In the illustrated example, the etching is made up to the surface of the n-type AlGaAs layer 52. The resultant recess 74 has a side wall surface 74a rising from the bottom surface 74b, along a curve having a constant radius of curvature, to the upper edge of the n+-type GaAs layer 54.

Figure 1G:
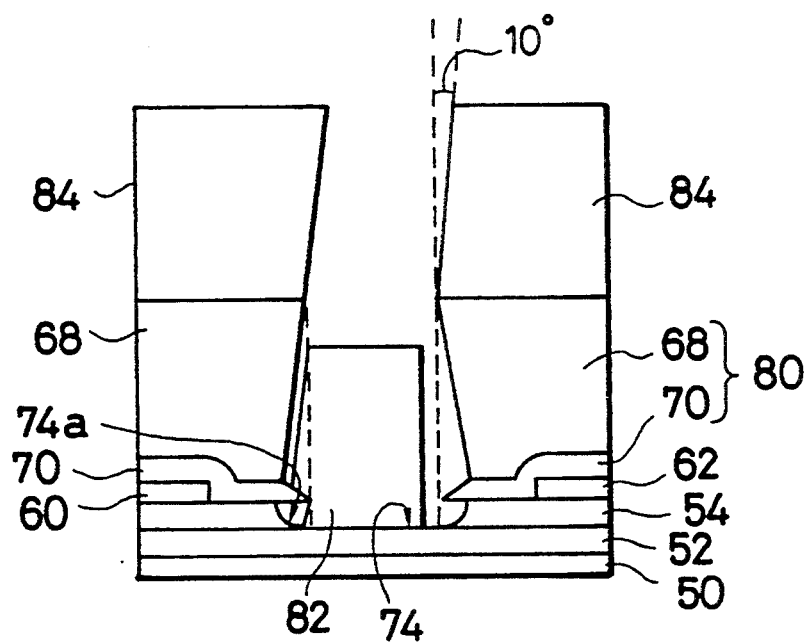
Figure 2E:
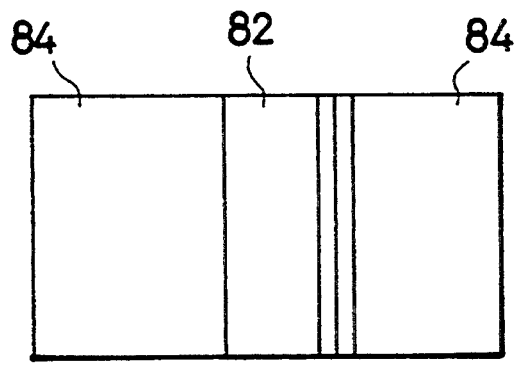

Then, using the two-layer mask 80, an oblique vapor-deposition is performed. By this oblique vapor-deposition, a gate electrode (also called a second electrode) 82 is formed over an area extending from the bottom surface 74b of the recess 74 to part of the side wall surface 74a of the recess 74 on one side, e.g., the side toward the source electrode 60. The resultant structure is shown in FIG. 1G and FIG. 2E. The oblique vapor deposition is conducted by vacuum vapor deposition (evaporation), and the deposited metal may be any metal which is known to be a suitable material for a gate electrode. In this embodiment, the gate electrode 82 comprises two layers, the lower one formed on the bottom surface 74$b$ of the recess 74 is made of titanium (Ti) and has a thickness of about 1000 to 2000 Angstroms and the upper one formed on the lower layer is made of aluminum and has a thickness of about 5000 to 7000 Angstroms. One part (major part, in the illustrated embodiment) of the gate electrode 82 is formed on the bottom surface 74$b$ of the recess 74, and the remaining part (end part, in the illustrated embodiment) is formed on the side wall surface 74$a$. The gate electrode 82 is formed to have a Schottky contact with the layers 52 and 54. In this embodiment, the angle of inclination $\theta$ is 10°. This angle of inclination may be any other suitable value depending on the design. By the vapor deposition, a metal layer 84 is also formed on the resist pattern 68.

Figure 1H:
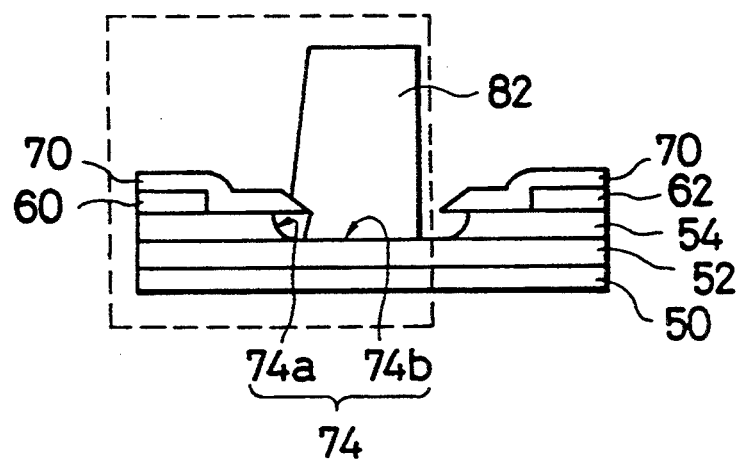
Figure 2F:
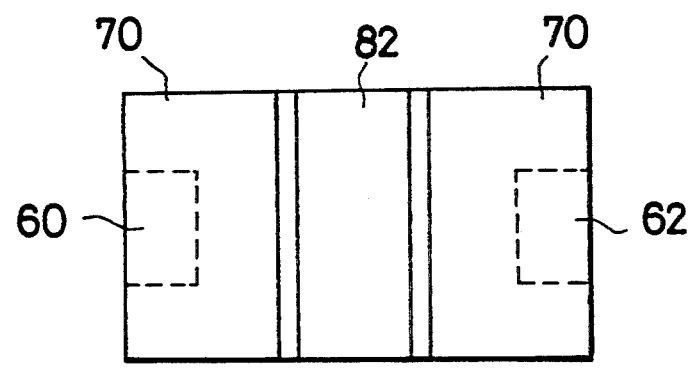

Subsequently, the resist pattern 68 is removed by lift-off. By the lift-off, the undesired gate metal layer 84 is removed while the gate electrode 82 is retained, to obtain a basic structure of the GaAs HEMT device (FIG. 1H and FIG. 2F). In FIG. 1H and FIG. 2F, one of the insulating films, 70, forming the two-layer mask 80 is retained. But, this layer 70 may be removed if desired later in a suitable step.

In the device shown in. FIG. 1H, the undoped GaAs layer 50 and the n-type AlGaAs layer 52 serve as an active layer, the n$^+$-type GaAs layer 54 serves as a cap layer, and the layers 50, 52 and 54 form a multi-layer structure. The first and third electrodes 60 and 62 are on the opposite sides of the recess 74, and hence on the opposites sides of the gate electrode 82.

Figure 3:
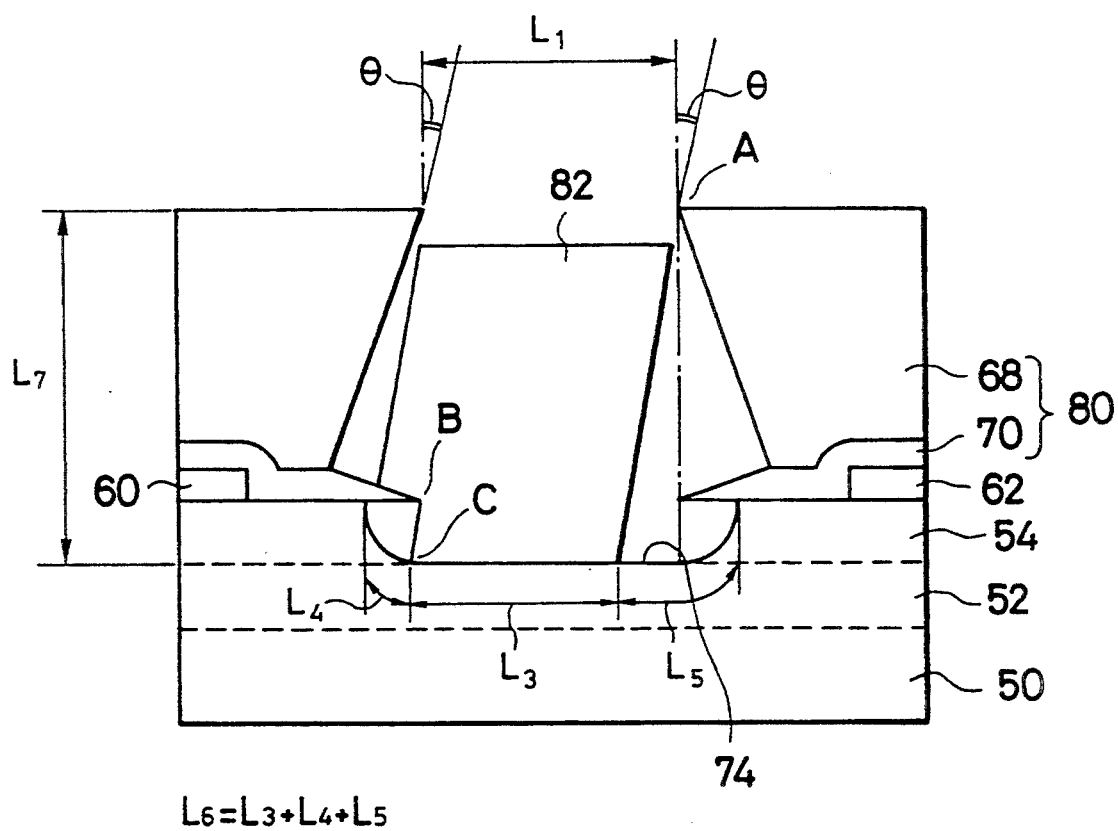
FIG. 3 is a schematic sectional view showing, in an enlarged scale, a gate electrode formed by oblique vapor deposition and its surrounding structure.
Figure 4:
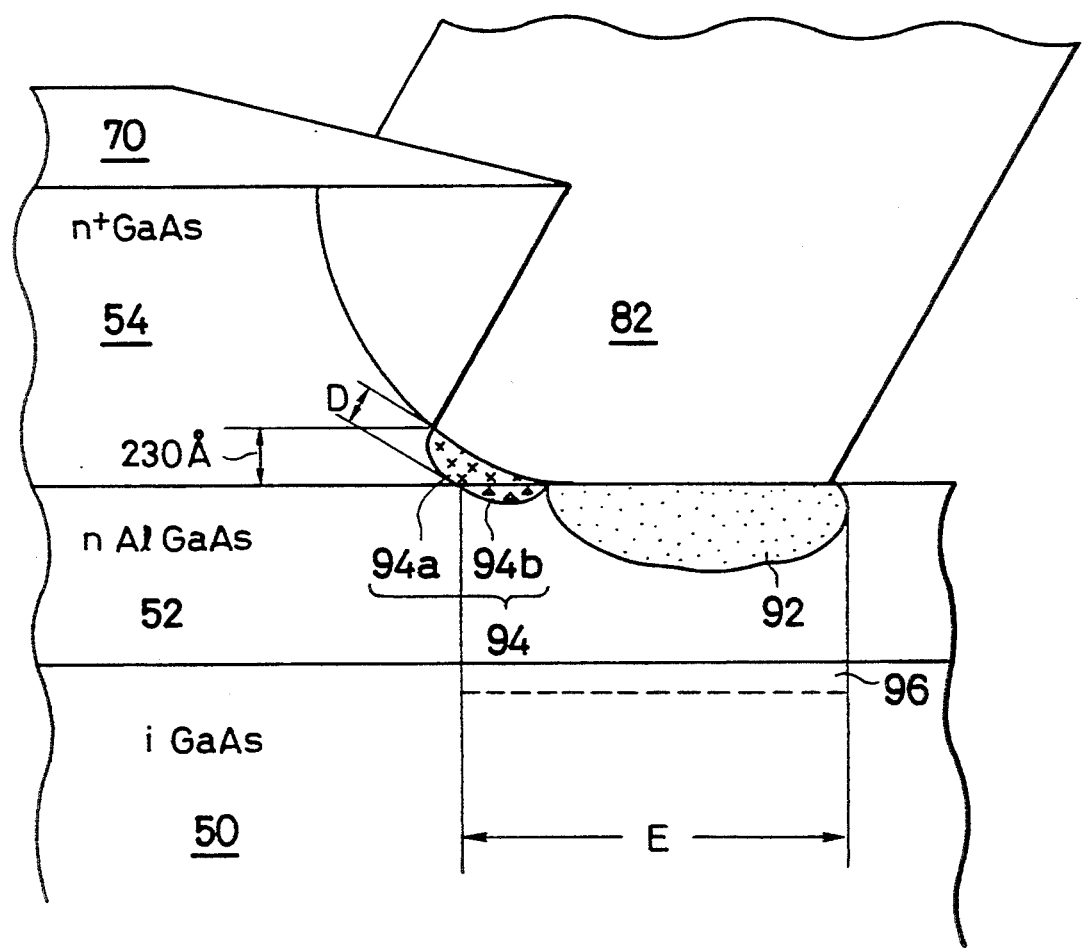
FIG. 4 is a sectional view showing the depletion region in the n-type AlGaAs layer and n+-type GaAs layer.

The gate electrode formed by the oblique vapor deposition is now be described in further detail with reference to FIG. 3 to FIG. 5. In these figures, the reference numerals identical to those in FIG. 1A to FIG. 1H and FIG. 2A to FIG. 2F denote identical or corresponding parts or members.

As was already described, the distance in the direction of the length of the gate of the opening at the top edge of the resist pattern 68 is denoted by $L_1$. For the purpose of the following explanation, the interface between the gate electrode 82 and the layers 52 and 54 is called a "gate electrode interface", and it is assumed that the length (under-gate length) of the gate electrode interface is denoted by $L_3$, the distance (the gate-source distance) from the edge of the gate electrode interface on the side of the first electrode or source electrode 60 to the upper edge of the recess 74 is denoted by $L_4$, and the distance (gate-drain distance) from the edge of the gate electrode interface on the side of the third electrode or drain electrode 62 to the upper edge of the recess 74 is denoted by $L_5$, the recess length (the sum of $L_3$, $L_4$ and $L_5$) is denoted by $L_6$, and the distance (as measured in the vertical direction) from the bottom surface of the recess 74 to the surface of the resist pattern 80 is denoted by $L_7$.

The upper edge (resist edge) of the opening of the resist pattern 80 on the side of the drain electrode 62 is denoted by A, the edge (insulating film edge) of the opening of the insulating film pattern 70 on the side of the source electrode 60 is denoted by B, and the edge (gate edge) of the gate electrode interface which is on the side of the source electrode 60 is denoted by C.

According to the oblique vapor deposition, the length of the top part of the gate electrode 82 is determined by the distance $L_1$ between the top, opposite edges of the opening 66 of the resist pattern 68. The under-gate length $L_3$ of the gate electrode 82 is determined by the resist edge A, the insulating film edge B and the angle $\theta$ of the oblique vapor deposition. As a result, the gate electrode is formed in a self-aligned fashion, with its under-gate length having been reduced, as compared with the gate top length $L_1$. The under-gate length $L_3$ is the gate length. Accordingly, the gate length is shorter than the dimension of the opening of the resist pattern used for forming the gate electrode 82.

The inventors have been successful in forming a gate length as short as 0.15 μm by appropriately selecting the angle $\theta$ of deposition, and the distance $L_7$ and the position of the insulating film edge B.

Next, to reduce the source resistance, it is necessary to shorten the distance from the edge C of the gate electrode 82 (the edge of the gate electrode interface on the side of the source electrode 60) to the upper edge of the recess, i.e., the upper edge of the side wall surface 74$a$ of the n$^+$-type GaAs layer 54 on the side of the source electrode 60. In the invention, part of the gate electrode 82 is formed over the side wall 74$a$, and over the n$^+$-type GaAs layer 54. If the lower part of the gate electrode is in direct contact with the n$^+$-type GaAs layer 54, it is normally expected that the Schottky characteristics are degraded because of the high electron concentration in the n$^+$-type GaAs layer 54, and the leak current is increased due to decrease in the barrier height and increase in the ideality factor n of the Schottky I-V characteristics. However, the inventors have found that if the area over which the gate electrode is in contact with the n$^+$-type GaAs layer 54 is limited to the area in the vicinity of the area where the gate electrode 82 is in contact with the n-type AlGaAs layer 52 and where the n$^+$-type GaAs layer 54 is thin, such adverse effects can be avoided. This is due to a depletion region created in the n$^+$-type GaAs layer 54, as shown in FIG. 4 when no voltage is applied to the gate electrode 82. That is, a depletion region 92 is formed in the n-type AlGaAs layer 52 in the vicinity of the interface between the gate electrode 82 and the n-type AlGaAs layer 52, and a depletion region 94 is formed in the n$^+$-type GaAs layer 54 and the n-type AlGaAs layer 52 in the vicinity of the interface between the gate electrode 82 and the n$^+$-type GaAs layer 54. It is noted part 94$a$ of the depletion region 94 is formed in the n$^+$-type GaAs layer 54 and while another part 94$b$ of the depletion region 94 is formed in the n-type AlGaAs layer 52. The depletion regions 92 and 94 can be regarded as a continuous depletion region. In other words, an end of a depletion region created in the n-type AlGaAs layer 52 when no voltage is applied to the gate electrode 82 extends to an area of the n-type AlGaAs layer 52 below the n$^+$-type GaAs layer 54 on the side of source electrode 60. The depth D of the depletion region 94 is about 230 Angstroms, so that if the area over which the gate electrode 82 is in contact with the n$^+$-type GaAs layer 54 is limited to the area where the thickness of the n$^+$-type GaAs layer 54 is not more than 230 Angstroms, substantially the entire part (in the direction of the thickness) of the n$^+$-type GaAs layer 54 is depleted, so that the above-described adverse effects are avoided. Because the side wall 74$a$ rises gradually along a quarter circle, the thickness of the n$^+$-type GaAs layer 54 increases slowly in the vicinity of the edge of the interface between the gate electrode 82 and the n-type AlGaAs layer 52, so that the area over which the thickness of the n+-type GaAs layer 54 does not exceed the specific value, e.g., 230 Angstroms is relatively long. An additional advantage due to the gate electrode 82 being partially in contact with the side wall 74a is that the effective gate length E, which is the length of the depletion region (aggregate of the depletion regions 92 and 94) along the surface of the n-type AlGaAs layer 52 is shorter than the dimension of the gate electrode 82 along the surfaces of the of the n-type AlGaAs layer 52 and the n+-type GaAs layer 54 in the direction of the gate length. The two-dimensional electron gas layer 96 is formed over the area of the effective gate length E.

The structure having the above advantages is obtained through the process of fabrication described above. In particular, according to the invention, the recess 74 is formed by the isotropic etching which etches the heavily doped layer, i.e., the n+-type GaAs layer 54 evenly in all directions, and the gate electrode 82 is formed by the oblique vapor deposition. Because of the isotropic etching, the recess etching profile in the recess side wall 74a will be a quarter circle centered on the insulating film edge B. By the oblique vapor deposition, the gate electrode 82 is formed to cover part of the recess side wall 74a, extending from the edge of the recess bottom surface 74b. The gate-source distance $L_4$ is determined by the depth of the etching and the angle $\theta$ of oblique vapor deposition. Fluctuations in the source resistance are thereby avoided.

Figure 5:
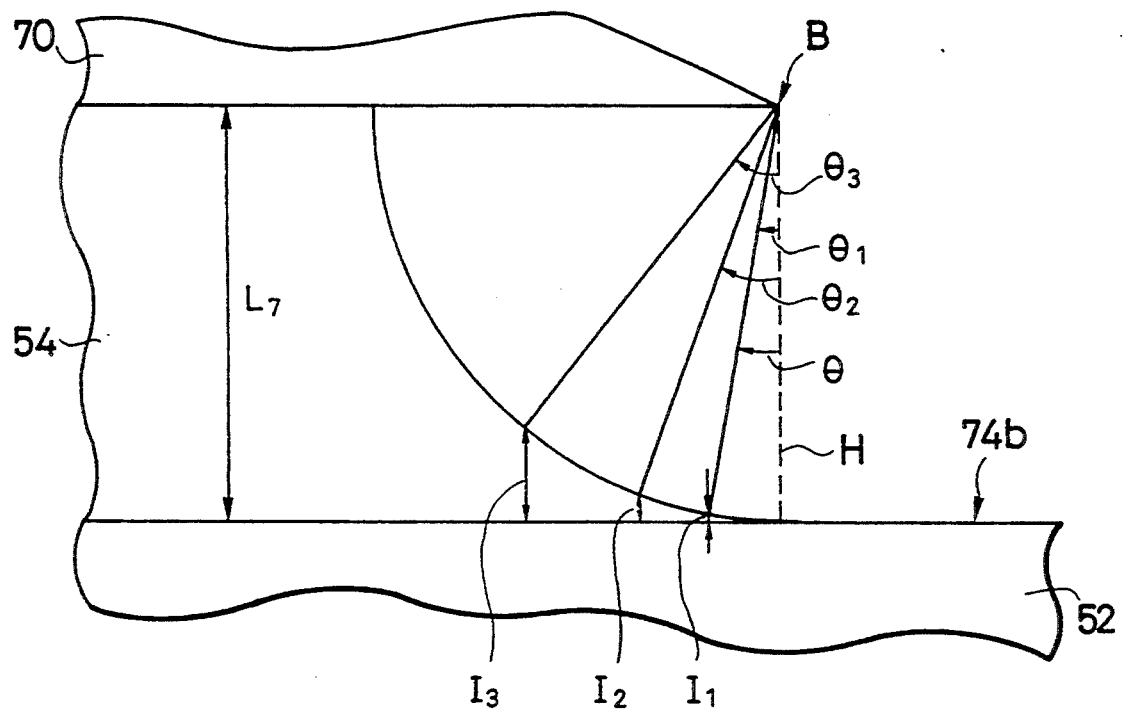
FIG. 5 shows the relationship between the angle of deposition and the state of the gate electrode formed on a recess by-the oblique vapor deposition.
Figure 6A:
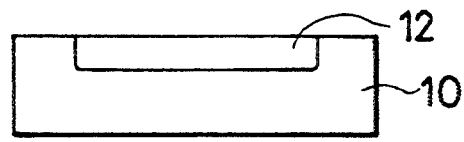
FIG. 6A to FIG. 6F are sectional views of a field-effect-transistor (FET) at various process steps in a method in the prior art.
Figure 6B:
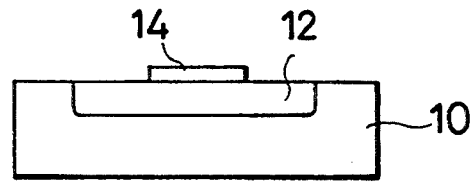
Figure 6C:
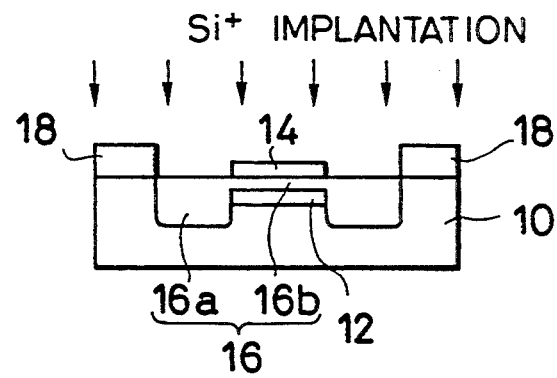
Figure 6D:
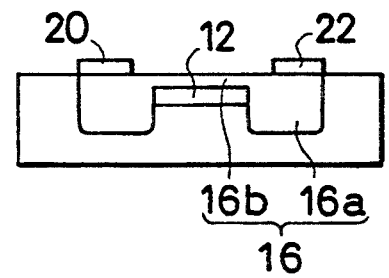
Figure 6E:
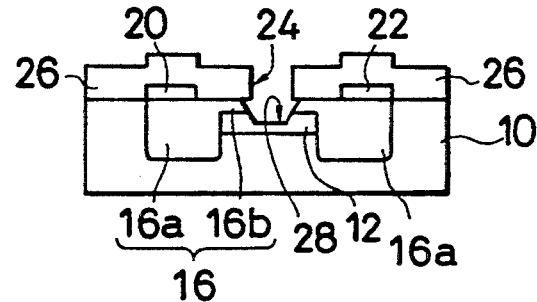
Figure 6F:
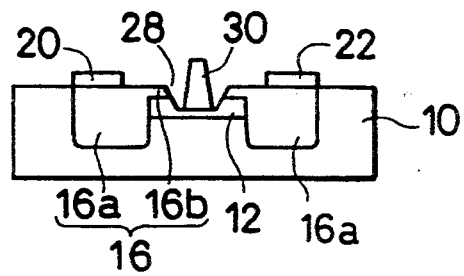
Figure 7:
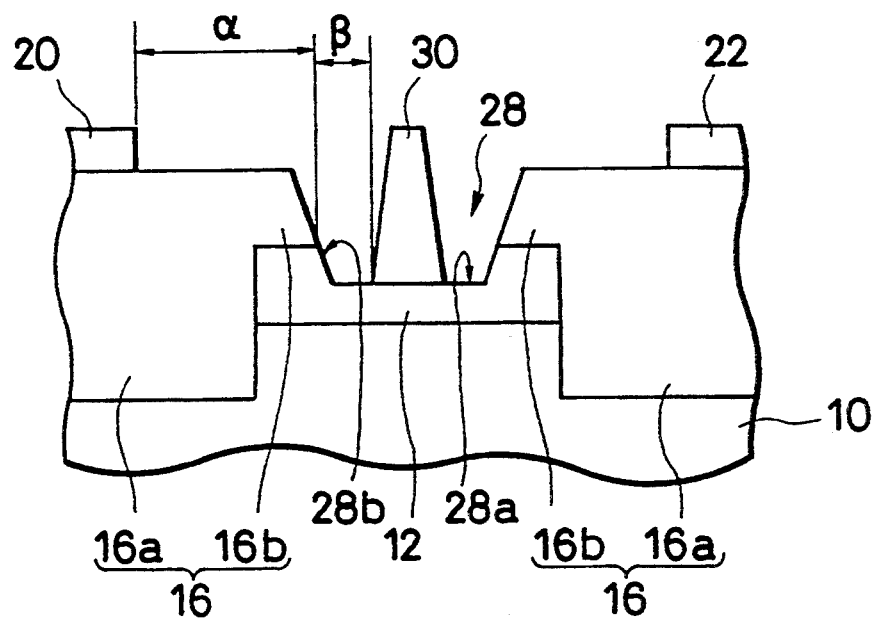
FIG. 7 is a sectional diagram showing the gate electrode and its neighboring structure, in an enlarged scale, at the same step as in FIG. 6F.

Referring to FIG. 5, the relationship between the characteristics of the HEMT device fabricated in the above described manner, and the isotropic etching and the oblique vapor deposition is explained. As was described above, when the n+-type GaAs layer 54 is side-etched by the isotropic etching, the etching profile (along a section normal to the surface of the layer 50 and parallel to the direction of the length of the gate) is substantially a quarter circle. The length over which the gate electrode 82 extends to cover the curved side wall surface 74a is determined by the deposition angle $\theta$ with reference to a vertical line H (indicated by dotted lines). FIG. 5 shows cases where the n+-type GaAs layer 54 is 1000 Angstroms thick and has a carrier concentration of $2\times10^{18}/cm^3$, and the deposition angles $\theta$ are $\theta_1=10°$, $\theta_2=20°$, and $\theta_3=40°$, respectively. The vertical distances from the bottom surface 74b of the recess, i.e., the remaining thicknesses $I_1$, $I_2$ and $I_3$ of the n+-type GaAs layer 54 in the respective cases were 15 Angstroms, 60 Angstroms and 230 Angstroms. The thickness of 230 Angstroms correspond to the thickness of the depletion region which is formed when the gate electrode 82 is in direct contact with the n+]GaAs layer 54 and no voltage is applied to the gate electrode (with the thickness and the carrier concentration of the upper n+-type GaAs layer 54 being as described above). Accordingly, if the deposition angle $\theta$ is set smaller than 40°, the remaining thickness of the n+-type GaAs layer 54 will be smaller than the thickness of the depletion region, and even if the gate electrode is in contact with the n+-type GaAs layer 54, since the n+-type GaAs layer 54 is depleted in the region of the contact, the Schottky characteristics are not degraded.

In the above-described embodiment, specific materials are used and specific conditions are used for the fabrication. It is, however, possible to adopt various modifications and alterations. For instance, in the above embodiment, the recess 74 is formed to extend from the surface of the n+-type GaAs layer 54 to the surface of the n-type AlGaAs layer 52. However, the recess etching may be conducted to leave a part of the thickness of the n+-type GaAs layer 54. If the thickness of the remaining n+-type GaAs layer 54 is not more than 230 Angstroms, or not more than 215 Angstroms to leave some margin, the Schottky characteristics of the device are not degraded.

As an alternative, the recess etching may be conducted to remove part of the thickness of the n-type AlGaAs layer 52. If the gate electrode 82 extends to cover part of the side wall surface 74a of the recess 74, the Schottky characteristics are not degraded. In either case, it is possible to form the gate electrode 82 in such a way that part of the gate electrode 82 covers the side wall surface 74a on the side of the source electrode 60 so that an end of the depletion region created in the n-type AlGaAs layer 52 (serving as part of an active layer) when no voltage is applied to the gate electrode 82 extends to an area below the n+-type GaAs layer 54. The Schottky characteristics are therefore maintained.

Moreover, since the edge C of the gate electrode 82 on the side of the source electrode 82 is in contact with or in proximity with the n+-type GaAs layer 54, the source resistance is lowered.

Even if the position of the insulating film edge B is shifted (in the step of FIG. 1E), the end of the gate electrode 82 in the recess 74 on the side of the source electrode 60 is determined based on the edge B, so that the source-gate distance $L_4$ is maintained constant, provided that the thickness of the n+-type GaAs layer 54 is constant.

In the above-described embodiment, an n-type AlGaAs layer and an n+-type GaAs layer are formed in turn on a GaAs layer. The invention is also applicable to any structure where an n+-type GaAs layer is formed as a cap layer, e.g., a structure having an n-type GaAs layer and an n+-type GaAs layer, and a structure having a p-type GaAs layer, an n-type GaAs layer and an n+-type GaAs layer.

The invention is also applicable to compound semiconductor devices using other materials such as InGaAs and InAlAs.

The invention is not limited to HEMT devices, but also applicable to MES FETs, MIS FETs, HEFTs, and diodes. Where the invention is applied to diodes, part enclosed by dotted lines in FIG. 1H may be utilized or such part alone may be fabricated. In such a diode, the source electrode 60 serves as a first electrode and the gate electrode 82 serves as a second electrode.

Merits and advantages attained from the invention are summarized below:

The semiconductor layer can be so formed that a heavily doped layer is in contact with or in the proximity of the second electrode, so that the resistance between the second electrode and the first electrode provided on the heavily doped layer is lowered.

Moreover, if the thickness of the heavily doped layer is constant, the recess distance between the first and second electrodes is determined by the recess etching and the oblique vapor deposition in a self-aligned fashion, so that the reproducibility of the recess distance is improved. The mutual conductance is therefore improved.

Furthermore, the distance over which the second electrode is in contact with the recess surface (gate length or the distance in the direction of the gate length)

can be made shorter than the distance between the opposite top edges of the opening of the resist pattern provided for the formation of the second electrode.

In addition, part of the heavily doped layer where the second electrode is in contact is fully depleted, so that the Schottky characteristics are not degraded.

What is claimed is:

1. A semiconductor device comprising:
   a semiconductor substrate having a major surface;
   an active layer formed on the major surface, the active layer having a first region, a second region and a third region disposed between the first and second regions;
   a first heavily doped layer formed on the first region, the first heavily doped layer having a first upper surface, and having a full-thickness part, a gradually increasing-thickness part and a side wall rising from the first region;
   a second heavily doped layer formed on the second region, the second heavily doped layer having a second upper surface;
   a first electrode formed on the first upper surface; and
   a second electrode formed on the third region, the second electrode having a bottom part and a side wall,
   the second electrode being disposed nearer to the first heavily doped layer than to the second heavily doped layer, the side wall of the second electrode not being in contact with the first heavily doped layer, and one edge of the bottom part of the second electrode being in contact with a part of the gradually increasing-thickness part of the first heavily doped layer at a location adjacent to a location where the second electrode is in contact with the third region.

2. The semiconductor device of claim 1, wherein the active layer comprises a lightly doped layer and an undoped layer so that a two-dimensional electron gas is generated at an interface between the lightly doped layer and the undoped layer.

3. The semiconductor device of claim 2, wherein the undoped layer is a GaAs layer, and the lightly doped layer is an n-type AlGaAs layer.

4. The semiconductor device of claim 1, wherein each of the first and second heavily doped layers is an $n^+$-type GaAs layer.

5. The semiconductor device of claim 1, wherein the first electrode has an ohmic contact with the first upper surface, and the second electrode has a Schottky contact with the third region.

6. The semiconductor device of claim 5, wherein the first electrode is a source electrode, and the second electrode is a gate electrode.

7. The semiconductor device of claim 1, further comprising a third electrode formed on the second upper surface.

8. The semiconductor device of claim 7, wherein the third electrode is a drain electrode.

* * * * *